(12) United States Patent
Seutter et al.

(10) Patent No.: US 8,114,789 B2
(45) Date of Patent: Feb. 14, 2012

(54) FORMATION OF A TANTALUM-NITRIDE LAYER

(75) Inventors: Sean M. Seutter, Fremont, CA (US); Michael X. Yang, Palo Alto, CA (US); Ming Xi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/846,253

(22) Filed: Jul. 29, 2010

(65) Prior Publication Data

US 2010/0311237 A1  Dec. 9, 2010

Related U.S. Application Data

(63) Continuation of application No. 11/240,189, filed on Sep. 30, 2005, now Pat. No. 7,781,326, which is a continuation of application No. 11/088,072, filed on Mar. 23, 2005, now Pat. No. 7,094,680, which is a continuation of application No. 09/776,329, filed on Feb. 2, 2001, now Pat. No. 6,951,804.

(51) Int. Cl.
*H01L 21/469* (2006.01)

(52) U.S. Cl. .................................................... 438/785

(58) Field of Classification Search ................... None
See application file for complete search history.

(56) References Cited

U.S. PATENT DOCUMENTS

| | | | | |
|---|---|---|---|---|
| 4,389,973 A | * | 6/1983 | Suntola et al. | 118/725 |
| 4,517,223 A | * | 5/1985 | Ovshinsky et al. | 427/575 |
| 4,615,905 A | * | 10/1986 | Ovshinsky et al. | 427/575 |
| 4,664,937 A | * | 5/1987 | Ovshinsky et al. | 427/575 |
| 4,747,367 A | * | 5/1988 | Posa | 118/715 |
| 4,761,269 A | * | 8/1988 | Conger et al. | 118/679 |
| 4,825,809 A | | 5/1989 | Mieno et al. | |
| 4,828,224 A | * | 5/1989 | Crabb et al. | 251/298 |
| 4,838,993 A | | 6/1989 | Aoki et al. | |
| 4,840,921 A | | 6/1989 | Matsumoto | |
| 4,845,049 A | | 7/1989 | Sunakawa | |
| 4,846,102 A | * | 7/1989 | Ozias | 118/730 |
| 4,859,625 A | | 8/1989 | Matsumoto | |
| 4,859,627 A | | 8/1989 | Sunakawa et al. | |
| 4,861,417 A | | 8/1989 | Mochizuki et al. | |
| 4,876,218 A | | 10/1989 | Pessa et al. | |

(Continued)

FOREIGN PATENT DOCUMENTS

DE   19820147 A1   7/1999

(Continued)

OTHER PUBLICATIONS

Hultman, et al., "Review of the thermal and mechanical stability of TiN-based thin films", *Zeitschrift Fur Metallkunde*, 90(10) (Oct. 1999), pp. 803-813.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13-16, 1998), pp. 337-342.

Klaus, et al., "Atomic Layer Deposition of Tungsten using Sequential Surface Chemistry with a Sacrificial Stripping Reaction," *Thin Solid Films* 360 (2000), pp. 145-153, (Accepted Nov. 16, 1999).

(Continued)

*Primary Examiner* — David Graybill

(74) *Attorney, Agent, or Firm* — Patterson & Sheridan, L.L.P.

(57) ABSTRACT

A method of forming a material on a substrate is disclosed. In one embodiment, the method includes forming a tantalum nitride layer on a substrate disposed in a plasma process chamber by sequentially exposing the substrate to a tantalum precursor and a nitrogen precursor, followed by reducing a nitrogen concentration of the tantalum nitride layer by exposing the substrate to a plasma annealing process. A metal-containing layer is subsequently deposited on the tantalum nitride layer.

20 Claims, 6 Drawing Sheets

U.S. PATENT DOCUMENTS

| | | | |
|---|---|---|---|
| 4,917,556 A | 4/1990 | Stark et al. | |
| 4,927,670 A | 5/1990 | Erbil | |
| 4,931,132 A | 6/1990 | Aspnes et al. | |
| 4,951,601 A | 8/1990 | Maydan et al. | |
| 4,960,720 A | 10/1990 | Shimbo et al. | |
| 4,975,252 A | 12/1990 | Nishizawa et al. | |
| 4,993,357 A | 2/1991 | Scholz | |
| 5,000,113 A | 3/1991 | Wang et al. | |
| 5,013,683 A | 5/1991 | Petroff et al. | |
| 5,028,565 A | 7/1991 | Chang et al. | |
| 5,082,798 A | 1/1992 | Arimoto et al. | |
| 5,085,885 A | 2/1992 | Foley et al. | |
| 5,091,320 A | 2/1992 | Aspnes et al. | |
| 5,092,728 A * | 3/1992 | Crabb et al. | 414/217 |
| 5,096,534 A * | 3/1992 | Ozias | 117/102 |
| 5,130,269 A | 7/1992 | Kitahara et al. | |
| 5,134,965 A * | 8/1992 | Tokuda et al. | 118/723 MW |
| 5,156,521 A * | 10/1992 | Crabb et al. | 414/805 |
| 5,166,092 A | 11/1992 | Mochizuki et al. | |
| 5,173,474 A | 12/1992 | Connell et al. | |
| 5,186,718 A | 2/1993 | Tepman et al. | |
| 5,205,077 A | 4/1993 | Wittstock | |
| 5,221,449 A | 6/1993 | Colgan et al. | |
| 5,221,556 A * | 6/1993 | Hawkins et al. | 427/255.17 |
| 5,225,366 A | 7/1993 | Yoder | |
| 5,234,561 A | 8/1993 | Randhawa et al. | |
| 5,244,694 A * | 9/1993 | Ozias | 427/248.1 |
| 5,246,536 A | 9/1993 | Nishizawa et al. | |
| 5,250,148 A | 10/1993 | Nishizawa et al. | |
| 5,254,207 A | 10/1993 | Nishizawa et al. | |
| 5,259,881 A | 11/1993 | Edwards et al. | |
| 5,270,247 A | 12/1993 | Sakuma et al. | |
| 5,278,435 A | 1/1994 | Van Hove et al. | |
| 5,281,274 A | 1/1994 | Yoder | |
| 5,286,296 A | 2/1994 | Sato et al. | |
| 5,290,748 A | 3/1994 | Knuuttila et al. | |
| 5,294,286 A | 3/1994 | Nishizawa et al. | |
| 5,294,572 A * | 3/1994 | Granneman et al. | 438/694 |
| 5,296,403 A | 3/1994 | Nishizawa et al. | |
| 5,300,186 A | 4/1994 | Kitahara et al. | |
| 5,311,055 A | 5/1994 | Goodman et al. | |
| 5,316,615 A | 5/1994 | Copel et al. | |
| 5,316,793 A | 5/1994 | Wallace et al. | |
| 5,330,610 A | 7/1994 | Eres et al. | |
| 5,336,324 A | 8/1994 | Stall et al. | |
| 5,336,325 A * | 8/1994 | Devilbiss et al. | 118/719 |
| 5,338,389 A | 8/1994 | Nishizawa et al. | |
| 5,348,911 A | 9/1994 | Jurgensen et al. | |
| 5,374,570 A | 12/1994 | Nasu et al. | |
| 5,395,791 A | 3/1995 | Cheng et al. | |
| 5,435,682 A * | 7/1995 | Crabb et al. | 414/217 |
| 5,438,952 A | 8/1995 | Otsuka et al. | |
| 5,439,876 A | 8/1995 | Graf et al. | |
| 5,441,703 A | 8/1995 | Jurgensen | |
| 5,443,033 A | 8/1995 | Nishizawa et al. | |
| 5,443,647 A | 8/1995 | Aucoin et al. | |
| 5,455,072 A | 10/1995 | Bension et al. | |
| 5,458,084 A | 10/1995 | Thorne et al. | |
| 5,469,806 A | 11/1995 | Mochizuki et al. | |
| 5,480,818 A | 1/1996 | Matsumoto et al. | |
| 5,483,919 A | 1/1996 | Yokoyama et al. | |
| 5,484,664 A | 1/1996 | Kitahara et al. | |
| 5,489,362 A * | 2/1996 | Steinhardt et al. | 438/727 |
| 5,503,875 A | 4/1996 | Imai et al. | |
| 5,521,126 A | 5/1996 | Okamura et al. | |
| 5,527,733 A | 6/1996 | Nishizawa et al. | |
| 5,532,511 A | 7/1996 | Nishizawa et al. | |
| 5,540,783 A | 7/1996 | Eres et al. | |
| 5,580,380 A | 12/1996 | Liu et al. | |
| 5,601,651 A | 2/1997 | Watabe et al. | |
| 5,609,689 A | 3/1997 | Kato et al. | |
| 5,616,181 A | 4/1997 | Yamamoto et al. | |
| 5,637,530 A | 6/1997 | Gaines et al. | |
| 5,641,984 A | 6/1997 | Aftergut et al. | |
| 5,644,128 A | 7/1997 | Wollnik et al. | |
| 5,662,470 A * | 9/1997 | Huussen et al. | 432/241 |
| 5,667,592 A | 9/1997 | Boitnott et al. | |
| 5,674,786 A | 10/1997 | Turner et al. | |
| 5,693,139 A | 12/1997 | Nishizawa et al. | |
| 5,695,564 A | 12/1997 | Imahashi et al. | |
| 5,705,224 A | 1/1998 | Murota et al. | |
| 5,707,880 A | 1/1998 | Aftergut et al. | |
| 5,711,811 A | 1/1998 | Suntola et al. | |
| 5,730,801 A | 3/1998 | Tepman et al. | |
| 5,730,802 A | 3/1998 | Ishizumi et al. | |
| 5,747,113 A | 5/1998 | Tsai | |
| 5,749,974 A | 5/1998 | Habuka et al. | |
| 5,788,447 A | 8/1998 | Yonemitsu et al. | |
| 5,788,799 A | 8/1998 | Steger et al. | |
| 5,796,116 A | 8/1998 | Nakata et al. | |
| 5,801,634 A | 9/1998 | Young et al. | |
| 5,807,792 A | 9/1998 | Ilg et al. | |
| 5,830,270 A | 11/1998 | McKee et al. | |
| 5,835,677 A | 11/1998 | Li et al. | |
| 5,851,849 A | 12/1998 | Comizzoli et al. | |
| 5,855,675 A | 1/1999 | Doering et al. | |
| 5,855,680 A | 1/1999 | Soininen et al. | |
| 5,856,219 A | 1/1999 | Naito et al. | |
| 5,858,102 A | 1/1999 | Tsai | |
| 5,866,213 A | 2/1999 | Foster et al. | |
| 5,866,795 A | 2/1999 | Wang et al. | |
| 5,879,459 A | 3/1999 | Gadgil et al. | |
| 5,882,165 A | 3/1999 | Maydan et al. | |
| 5,882,413 A | 3/1999 | Beaulieu et al. | |
| 5,904,565 A | 5/1999 | Nguyen et al. | |
| 5,916,365 A | 6/1999 | Sherman | |
| 5,923,056 A | 7/1999 | Lee et al. | |
| 5,923,985 A | 7/1999 | Aoki et al. | |
| 5,925,574 A | 7/1999 | Aoki et al. | |
| 5,928,389 A | 7/1999 | Jevtic | |
| 5,935,490 A | 8/1999 | Archbold et al. | |
| 5,942,040 A | 8/1999 | Kim et al. | |
| 5,947,710 A | 9/1999 | Cooper et al. | |
| 5,951,771 A | 9/1999 | Raney et al. | |
| 5,972,430 A | 10/1999 | DiMeo, Jr. et al. | |
| 5,989,999 A | 11/1999 | Levine et al. | |
| 6,001,415 A | 12/1999 | Nogami et al. | |
| 6,001,669 A | 12/1999 | Gaines et al. | |
| 6,013,575 A | 1/2000 | Itoh | |
| 6,015,590 A | 1/2000 | Suntola et al. | |
| 6,025,627 A | 2/2000 | Forbes et al. | |
| 6,036,773 A | 3/2000 | Wang et al. | |
| 6,042,652 A | 3/2000 | Hyun et al. | |
| 6,043,177 A | 3/2000 | Falconer et al. | |
| 6,051,286 A | 4/2000 | Zhao et al. | |
| 6,062,798 A | 5/2000 | Muka | |
| 6,067,222 A | 5/2000 | Hausmann | |
| 6,071,808 A | 6/2000 | Merchant et al. | |
| 6,084,302 A | 7/2000 | Sandhu | |
| 6,086,677 A | 7/2000 | Umotoy et al. | |
| 6,110,556 A | 8/2000 | Bang et al. | |
| 6,113,977 A | 9/2000 | Soininen et al. | |
| 6,117,244 A | 9/2000 | Bang et al. | |
| 6,124,158 A | 9/2000 | Dautartas et al. | |
| 6,124,203 A | 9/2000 | Joo et al. | |
| 6,130,147 A | 10/2000 | Major et al. | |
| 6,139,700 A | 10/2000 | Kang et al. | |
| 6,140,237 A | 10/2000 | Chan et al. | |
| 6,140,238 A | 10/2000 | Kitch | |
| 6,143,077 A | 11/2000 | Ikeda et al. | |
| 6,143,659 A | 11/2000 | Leem | |
| 6,144,060 A | 11/2000 | Park et al. | |
| 6,158,446 A | 12/2000 | Mohindra et al. | |
| 6,174,377 B1 | 1/2001 | Doering et al. | |
| 6,174,809 B1 | 1/2001 | Kang et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,207,302 B1 | 3/2001 | Sugiura et al. | |
| 6,248,605 B1 | 6/2001 | Harkonen et al. | |
| 6,270,572 B1 | 8/2001 | Kim et al. | |
| 6,271,148 B1 | 8/2001 | Kao et al. | |
| 6,287,965 B1 | 9/2001 | Kang et al. | |
| 6,291,876 B1 | 9/2001 | Stumborg et al. | |
| 6,305,314 B1 | 10/2001 | Sneh et al. | |
| 6,306,216 B1 | 10/2001 | Kim et al. | |
| 6,316,098 B1 | 11/2001 | Yitzchaik et al. | |

| | | | | | | |
|---|---|---|---|---|---|---|
| 6,416,822 | B1 | 7/2002 | Chiang et al. | JP | 63227007 A | 9/1988 |
| 6,428,847 | B1 | 8/2002 | Grant et al. | JP | 63252420 A | 10/1988 |
| 6,428,859 | B1 | 8/2002 | Chiang et al. | JP | 63266814 A | 11/1988 |
| 6,436,819 | B1 | 8/2002 | Zhang et al. | JP | 64009895 U | 1/1989 |
| 6,455,421 | B1 | 9/2002 | Itoh et al. | JP | 64009896 U | 1/1989 |
| 6,511,539 | B1 * | 1/2003 | Raaijmakers ............... 117/102 | JP | 64009897 U | 1/1989 |
| 6,573,150 | B1 | 6/2003 | Urdahl et al. | JP | 64037832 U | 3/1989 |
| 6,743,473 | B1 | 6/2004 | Parkhe et al. | JP | 01103982 A | 4/1989 |
| 6,797,108 | B2 | 9/2004 | Wendling | JP | 01103996 A | 4/1989 |
| 6,818,250 | B2 | 11/2004 | George et al. | JP | 01117017 A | 5/1989 |
| 6,951,804 | B2 | 10/2005 | Seutter et al. | JP | 1143221 A | 6/1989 |
| 6,984,591 | B1 * | 1/2006 | Buchanan et al. ............ 438/778 | JP | 01143233 A | 6/1989 |
| 7,094,680 | B2 | 8/2006 | Seutter et al. | JP | 01154511 A | 6/1989 |
| 7,402,210 | B2 | 7/2008 | Chen et al. | JP | 1236657 A | 9/1989 |
| 7,408,225 | B2 | 8/2008 | Shinriki et al. | JP | 1245512 A | 9/1989 |
| 2001/0000866 | A1 | 5/2001 | Sneh et al. | JP | 1264218 A | 10/1989 |
| 2001/0002280 | A1 * | 5/2001 | Sneh ...................... 427/255.28 | JP | 1270593 A | 10/1989 |
| 2001/0009140 | A1 | 7/2001 | Bondestam et al. | JP | 1272108 A | 10/1989 |
| 2001/0011526 | A1 | 8/2001 | Doering et al. | JP | 1290221 A | 11/1989 |
| 2001/0031562 | A1 | 10/2001 | Raaijmakers et al. | JP | 1290222 A | 11/1989 |
| 2001/0034123 | A1 | 10/2001 | Jeon et al. | JP | 1296673 A | 11/1989 |
| 2001/0041250 | A1 | 11/2001 | Werkhoven et al. | JP | 1303770 A | 12/1989 |
| 2001/0042799 | A1 | 11/2001 | Kim et al. | JP | 1305894 A | 12/1989 |
| 2002/0094632 | A1 | 7/2002 | Agarwal et al. | JP | 1313927 A | 12/1989 |
| 2002/0127336 | A1 | 9/2002 | Chen et al. | JP | 2012814 A | 1/1990 |
| 2003/0091739 | A1 | 5/2003 | Sakamoto et al. | JP | 2017634 A | 1/1990 |
| 2003/0121608 | A1 | 7/2003 | Chen et al. | JP | 2063115 A | 3/1990 |
| 2003/0124262 | A1 | 7/2003 | Chen et al. | JP | 2074029 A | 3/1990 |
| 2004/0241951 | A1 | 12/2004 | Amadon et al. | JP | 2074587 A | 3/1990 |
| 2005/0042373 | A1 | 2/2005 | Kraus et al. | JP | 2106822 A | 4/1990 |
| 2005/0139160 | A1 | 6/2005 | Lei et al. | JP | 2129913 A | 5/1990 |
| 2005/0173068 | A1 | 8/2005 | Chen et al. | JP | 2162717 A | 6/1990 |
| 2005/0252449 | A1 | 11/2005 | Nguyen et al. | JP | 2172895 A | 7/1990 |
| 2005/0271812 | A1 | 12/2005 | Myo et al. | JP | 2196092 A | 8/1990 |
| 2005/0271813 | A1 | 12/2005 | Kher et al. | JP | 2203517 A | 8/1990 |
| 2006/0216928 | A1 | 9/2006 | Chung et al. | JP | 02-230960 A | 9/1990 |
| 2007/0003698 | A1 | 1/2007 | Chen et al. | JP | 2230722 A | 9/1990 |
| 2007/0026147 | A1 | 2/2007 | Chen et al. | JP | 02-246161 A | 10/1990 |
| 2007/0059948 | A1 | 3/2007 | Metzner et al. | JP | 2264491 A | 10/1990 |
| 2007/0095285 | A1 | 5/2007 | Thakur et al. | JP | 2283084 A | 11/1990 |
| 2007/0119370 | A1 | 5/2007 | Ma et al. | JP | 02304916 A | 12/1990 |
| 2007/0119371 | A1 | 5/2007 | Ma et al. | JP | 3019211 A | 1/1991 |
| 2007/0128862 | A1 | 6/2007 | Ma et al. | JP | 3022569 A | 1/1991 |
| 2007/0128863 | A1 | 6/2007 | Ma et al. | JP | 3023294 A | 1/1991 |
| 2007/0128864 | A1 | 6/2007 | Ma et al. | JP | 3023299 A | 1/1991 |
| 2008/0038463 | A1 | 2/2008 | Chen et al. | JP | 3044967 A | 2/1991 |
| 2008/0041307 | A1 | 2/2008 | Nguyen et al. | JP | 3048421 A | 3/1991 |
| 2008/0041313 | A1 | 2/2008 | Chen et al. | JP | 3070124 A | 3/1991 |
| 2008/0044569 | A1 | 2/2008 | Myo et al. | JP | 3185716 A | 8/1991 |
| 2008/0102203 | A1 | 5/2008 | Wu et al. | JP | 3208885 A | 9/1991 |
| 2008/0102208 | A1 | 5/2008 | Wu et al. | JP | 3234025 A | 10/1991 |
| 2008/0107809 | A1 | 5/2008 | Wu et al. | JP | 3286522 A | 12/1991 |
| 2008/0268171 | A1 | 10/2008 | Ma et al. | JP | 3286531 A | 12/1991 |
| 2008/0274299 | A1 | 11/2008 | Chen et al. | JP | 4031391 A | 2/1992 |
| 2010/0311237 | A1 * | 12/2010 | Seutter et al. ................ 438/653 | JP | 4031396 A | 2/1992 |
| | | | | JP | 4100292 A | 4/1992 |
| FOREIGN PATENT DOCUMENTS | | | | JP | 4111418 A | 4/1992 |
| EP | 0344352 A1 | 12/1989 | | JP | 4132214 A | 5/1992 |
| EP | 0429270 A2 | 5/1991 | | JP | 4132681 A | 5/1992 |
| EP | 0442490 A1 | 8/1991 | | JP | 4151822 A | 5/1992 |
| EP | 0799641 A2 | 10/1997 | | JP | 4162418 A | 6/1992 |
| EP | 1077484 A2 | 2/2001 | | JP | 4175299 A | 6/1992 |
| FR | 2626110 A1 | 7/1989 | | JP | 4186824 A | 7/1992 |
| FR | 2692597 A1 | 12/1993 | | JP | 4212411 A | 8/1992 |
| JP | 58100419 A | 6/1983 | | JP | 4260696 A | 9/1992 |
| JP | 60065712 A | 4/1985 | | JP | 4273120 A | 9/1992 |
| JP | 61035847 A | 2/1986 | | JP | 4285167 A | 10/1992 |
| JP | 61210623 A | 9/1986 | | JP | 4291916 A | 10/1992 |
| JP | 62069508 A | 3/1987 | | JP | 4325500 A | 11/1992 |
| JP | 62091495 A | 4/1987 | | JP | 4328874 A | 11/1992 |
| JP | 62141717 A | 6/1987 | | JP | 5029228 A | 2/1993 |
| JP | 62167297 A | 7/1987 | | JP | 5047665 A | 2/1993 |
| JP | 62171999 A | 7/1987 | | JP | 5047668 A | 2/1993 |
| JP | 62232919 A | 10/1987 | | JP | 5074717 A | 3/1993 |
| JP | 63062313 A | 3/1988 | | JP | 5074724 A | 3/1993 |
| JP | 63085098 A | 4/1988 | | JP | 5102189 A | 4/1993 |
| JP | 63090833 A | 4/1988 | | JP | 5047666 U | 6/1993 |
| JP | 63222420 A | 9/1988 | | JP | 5160152 A | 6/1993 |
| JP | 63222421 A | 9/1988 | | JP | 5175143 A | 7/1993 |

| | | | |
|---|---|---|---|
| JP | 5175145 A | 7/1993 | |
| JP | 5182906 A | 7/1993 | |
| JP | 5186295 A | 7/1993 | |
| JP | 5206036 A | 8/1993 | |
| JP | 5234899 A | 9/1993 | |
| JP | 5235047 A | 9/1993 | |
| JP | 5251339 A | 9/1993 | |
| JP | 5270997 A | 10/1993 | |
| JP | 5291152 A | 11/1993 | |
| JP | 5304334 A | 11/1993 | |
| JP | 5343327 A | 12/1993 | |
| JP | 5343685 A | 12/1993 | |
| JP | 6045606 A | 2/1994 | |
| JP | 6132236 A | 5/1994 | |
| JP | 6177381 A | 6/1994 | |
| JP | 6196809 A | 7/1994 | |
| JP | 6222388 A | 8/1994 | |
| JP | 6224138 A | 8/1994 | |
| JP | 6230421 A | 8/1994 | |
| JP | 06291048 | 10/1994 | |
| JP | 7070752 A | 3/1995 | |
| JP | 7086269 A | 3/1995 | |
| JP | 8181076 A | 7/1996 | |
| JP | 8245291 A | 9/1996 | |
| JP | 08-283336 A | 10/1996 | |
| JP | 08264530 | 10/1996 | |
| JP | 09260786 | 10/1997 | |
| JP | 09293681 | 11/1997 | |
| JP | 10188840 | 7/1998 | |
| JP | 10190128 | 7/1998 | |
| JP | 10-308283 | 11/1998 | |
| JP | 11054458 A | 2/1999 | |
| JP | 11054459 A | 2/1999 | |
| JP | 11260824 A | 9/1999 | |
| JP | 11269652 | 10/1999 | |
| JP | 2000-031387 | 1/2000 | |
| JP | 2000-058777 | 2/2000 | |
| JP | 2000068072 | 3/2000 | |
| JP | 2000087029 | 3/2000 | |
| JP | 2000138094 | 5/2000 | |
| JP | 2000218445 | 8/2000 | |
| JP | 2000319772 A | 11/2000 | |
| JP | 2000340883 | 12/2000 | |
| JP | 2000353666 | 12/2000 | |
| JP | 2001020075 | 1/2001 | |
| JP | 2001020075 A | 1/2001 | |
| JP | 200162244 | 3/2001 | |
| JP | 2001144089 A | 5/2001 | |
| JP | 2001-172767 | 6/2001 | |
| JP | 2001152339 | 6/2001 | |
| JP | 2001189312 | 7/2001 | |
| JP | 2001-220294 | 8/2001 | |
| JP | 2001217206 A | 8/2001 | |
| JP | 2001220287 | 8/2001 | |
| JP | 2001220667 A | 8/2001 | |
| JP | 2001-254181 | 9/2001 | |
| JP | 2001240972 | 9/2001 | |
| JP | 2001284042 | 10/2001 | |
| JP | 2001303251 | 10/2001 | |
| JP | 2001328900 A | 11/2001 | |
| WO | WO-9002216 A1 | 3/1990 | |
| WO | WO-90/10510 A1 | 9/1990 | |
| WO | WO-9302111 A1 | 2/1993 | |
| WO | WO-9617107 A1 | 6/1996 | |
| WO | WO-9618756 A1 | 6/1996 | |
| WO | WO-9806889 A2 | 2/1998 | |
| WO | WO-9851838 A1 | 11/1998 | |
| WO | WO-9901595 A1 | 1/1999 | |
| WO | WO-9913504 A1 | 3/1999 | |
| WO | WO-9929924 A1 | 6/1999 | |
| WO | WO-9941423 A2 | 8/1999 | |
| WO | WO-99/63593 A1 | 12/1999 | |
| WO | WO-0011721 A1 | 3/2000 | |
| WO | WO-0015865 A1 | 3/2000 | |
| WO | WO-0015881 A2 | 3/2000 | |
| WO | WO-0016377 A2 | 3/2000 | |
| WO | WO-0054320 A1 | 9/2000 | |
| WO | WO-0063957 A1 | 10/2000 | |
| WO | WO-0079019 A1 | 12/2000 | |
| WO | WO-0079576 A1 | 12/2000 | |
| WO | WO-0115220 A1 | 3/2001 | |
| WO | WO-0127346 A1 | 4/2001 | |
| WO | WO-0127347 A1 | 4/2001 | |
| WO | WO-0129280 A1 | 4/2001 | |
| WO | WO-0129891 A1 | 4/2001 | |
| WO | WO-0129893 A1 | 4/2001 | |
| WO | WO-0136702 A1 | 5/2001 | |
| WO | WO-0140541 A1 | 6/2001 | |
| WO | WO-0166832 A2 | 9/2001 | |

OTHER PUBLICATIONS

Martensson, et al., "Atomic Layer Epitaxy of Copper on Tantalum", *Chemical Vapor Deposition*, 3(1) (Feb. 1, 1997), pp. 45-50.

Ritala, et al. "Atomic Layer Epitaxy Growth of TiN Thin Films", *J. Electrochem. Soc.*, 142(8) (Aug. 1995), pp. 2731-2737.

Lee, "The Preparation of Titanium-Based Thin Film by CVD Using Titanium Chlorides as Precursors", *Chemical Vapor Deposition*, 5(2) (Mar. 1999), pp. 69-73.

Martensson, et al., "Atomic Layer Epitaxy of Copper, Growth & Selectivity in the Cu (II)-2,2.6,6-Tetramethyl-3, 5-Heptanedion ATE/ $H_2$ Process", *J. Electrochem. Soc.*, 145(8) (Aug. 1998), pp. 2926-2931.

Min, et al.,"Chemical Vapor Deposition of Ti-Si-N Films with Alternating Source Supply", *Mat., Res. Soc. Symp. Proc.*, vol. 564 (Apr. 5, 1999), pp. 207-210.

Bedair, "Atomic layer epitaxy deposition processes", *J. Vac. Sci. Techol.* 12(1) (Jan./Feb. 1994).

Elam, et al., "Nucleation and growth during tungsten atomic layer deposition on $SiO_2$ surfaces," Thin Solid Films 386 (2001) pp. 41-52, (Accepted Dec. 14, 2000).

Suzuki, et al., "LPCVD-TiN Using Hydrazine and $TiCl_4$", VMIC Conference (Jun. 8-9, 1993), pp. 418-423.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search—Atomic Layer Deposition, search dated Oct. 16, 2001.

Abstracts of search results re atomic layer deposition, search dated Jan. 24, 2002.

NERAC Search abstract of "Atomic Layer deposition of Ta and Ti for Interconnect Diffusion Barriers", by Rossnagel, et al., J. Vac. Sci. & Tech., 18(4) (Jul. 2000).

Bader, et al., "Integrated Processing Equipment", Solid State Technology, Cowan Pub., vol. 33, No. 5 (May 1, 1990), pp. 149-154.

Choi, et al., "Stability of $TiB_2$ as a Diffusion Barrier on Silicon", J. Electrochem. Soc. 138(10) (Oct. 1991), pp. 3062-3067.

Choi, et al., "The effect of annealing on resistivity of low pressure chemical vapor depositied titanium diboride", J. Appl. Phys. 69(11) (Jun. 1, 1991), pp. 7853-7861.

International Search Report from the European Patent Office for International Application No. PCT/US 02/34277, dated May 9, 2003.

International Search Report from the European Patent Office for International Application No. PCT/US 02/34553, dated May 8, 2003.

Japan Office Action dated Sep. 30, 2008 for Japanese Application No. 2003-538423.

Korean Office Action dated Apr. 23, 2009, for Korean Application No. 10-2004-7006190.

Japanese Office Action issued Jul. 7, 2009 in Application No. 2003-541048 (APPM/005192 JAPA P03).

Min, et al., "Metal-Organic Atomic-Layer Deposition of Titanium-Silicon-Nitride Films", *Applied Physics Letters*, American Inst. of Physics, vol. 75(11) (Sep. 13, 1999).

"Applications of Integrated processing", Solid State Technology, US, Cowan Pub., vol. 37, No. 12 (Dec. 1, 1994), pp. 45-47.

* cited by examiner

FORMATION OF A TANTALUM-NITRIDE LAYER

CROSS-REFERENCE TO RELATED APPLICATIONS

This application is a continuation of U.S. Ser. No. 11/240,189, filed Sep. 30, 2005, now U.S. Pat. No. 7,781,326 which is a continuation of U.S. Ser. No. 11/088,072, filed Mar. 23, 2005, now U.S. Pat. No. 7,094,680, which is a continuation of U.S. Ser. No. 09/776,329, filed Feb. 2, 2001, now U.S. Pat. No. 6,951,804, all of which are hereby incorporated by reference in their entireties.

BACKGROUND OF THE INVENTION

1. Field of the Invention

The present invention relates to formation of one or more barrier layers and, more particularly, to one or more barrier layers formed using chemisorption techniques.

2. Description of the Related Art

In manufacturing integrated circuits, one or more barrier layers are often used to inhibit diffusion of one or more materials in metal layers, as well as other impurities from intermediate dielectric layers, into elements underlying such barrier layers, such as transistor gates, capacitor dielectrics, transistor wells, transistor channels, electrical barrier regions, interconnects, among other known elements of integrated circuits.

Though a barrier layer may limit to prevent migration of unwanted materials into such elements, its introduction creates an interface at least in part between itself and one or more metal layers. For sub half-micron (0.5 µm) semiconductor devices, microscopic reaction at an interface between metal and barrier layers can cause degradation of integrated circuits, including but not limited to increased electrical resistance of such metal layers. Accordingly, though barrier layers have become a component for improving reliability of interconnect metallization schemes, it is desirable to mitigate "side effects" caused by introduction of such barrier layers.

Compounds of refractory metals such as, for example, nitrides, borides, and carbides are targets as diffusion barriers because of their chemical inertness and low resistivities (e.g., sheet resistivities typically less than about 200 µΩ-cm). In particular, borides such as, including but not limited to titanium diboride ($TiB_2$), have been used as a barrier material owing to their low sheet resistivities (e.g., resistivities less than about 150 µΩ-cm).

Boride barrier layers are conventionally formed using chemical vapor deposition (CVD) techniques. For example, titanium tetrachloride ($TiCl_4$) may be reacted with diborane ($B_2H_6$) to form titanium diboride ($TiB_2$) using CVD. However, when Cl-based chemistries are used to form boride barrier layers, reliability problems can occur. In particular, boride layers formed using CVD chlorine-based chemistries typically have a relatively high chlorine (Cl) content, namely, chlorine content greater than about 3 percent. A high chlorine content is undesirable because migrating chlorine from a boride barrier layer into adjacent interconnection layer may increase contact resistance of such interconnection layer and potentially change one or more characteristics of integrated circuits made therewith.

Therefore, a need exists for barrier layers for integrated circuit fabrication with little to no side effects owing to their introduction. Particularly desirable would be a barrier layer useful for interconnect structures.

SUMMARY OF THE INVENTION

An aspect of the present invention is film deposition for integrated circuit fabrication. More particularly, at least one element from a first precursor and at least one element from a second precursor is chemisorbed on a surface. The at least one element from the first precursor and the at least one element from the second precursor are chemisorbed to provide a tantalum-nitride film. This sequence may be repeated to increase tantalum-nitride layer thickness. This type of deposition process is sometimes called atomic layer deposition (ALD). Such a tantalum-nitride layer may be used as a barrier layer.

Another aspect is forming the tantalum-nitride layer using in part annealing of at least one tantalum-nitride sublayer. This annealing may be done with a plasma.

Another aspect is using a plasma source gas as a nitrogen precursor. The plasma source gas may be used to provide a plasma, which may be sequentially reacted or co-reacted with a tantalum containing precursor.

In another aspect, a method of film deposition for integrated circuit fabrication includes forming a tantalum nitride layer by sequentially chemisorbing a tantalum precursor and a nitrogen precursor on a substrate disposed in a process chamber. A nitrogen concentration of the tantalum nitride layer is reduced by exposing the substrate to a plasma annealing process. A metal-containing layer is subsequently deposited on the tantalum nitride layer.

In another aspect, a method of film deposition for integrated circuit fabrication includes forming a tantalum nitride layer with a first nitrogen concentration on a substrate by an atomic layer deposition process. An upper portion of the tantalum nitride layer is exposed to a plasma annealing process to form a tantalum-containing layer with a second nitrogen concentration. A metal-containing layer is then deposited on the tantalum-containing layer.

In another aspect, a method of film deposition for integrated circuit fabrication includes forming a tantalum-containing layer with a sheet resistance of about 1,200 µΩ-cm or less by a plasma annealing process on a tantalum nitride layer deposited by an atomic layer deposition process on a substrate.

In yet another aspect, a method of forming a material on a substrate is disclosed. In one embodiment, the method includes forming a tantalum nitride layer on a substrate disposed in a plasma process chamber by sequentially exposing the substrate to a tantalum precursor and a nitrogen precursor, followed by reducing a nitrogen concentration of the tantalum nitride layer by exposing the substrate to a plasma annealing process. A metal-containing layer is then deposited on the tantalum nitride layer by a deposition process.

These and other aspects of the present invention will be more apparent from the following description.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
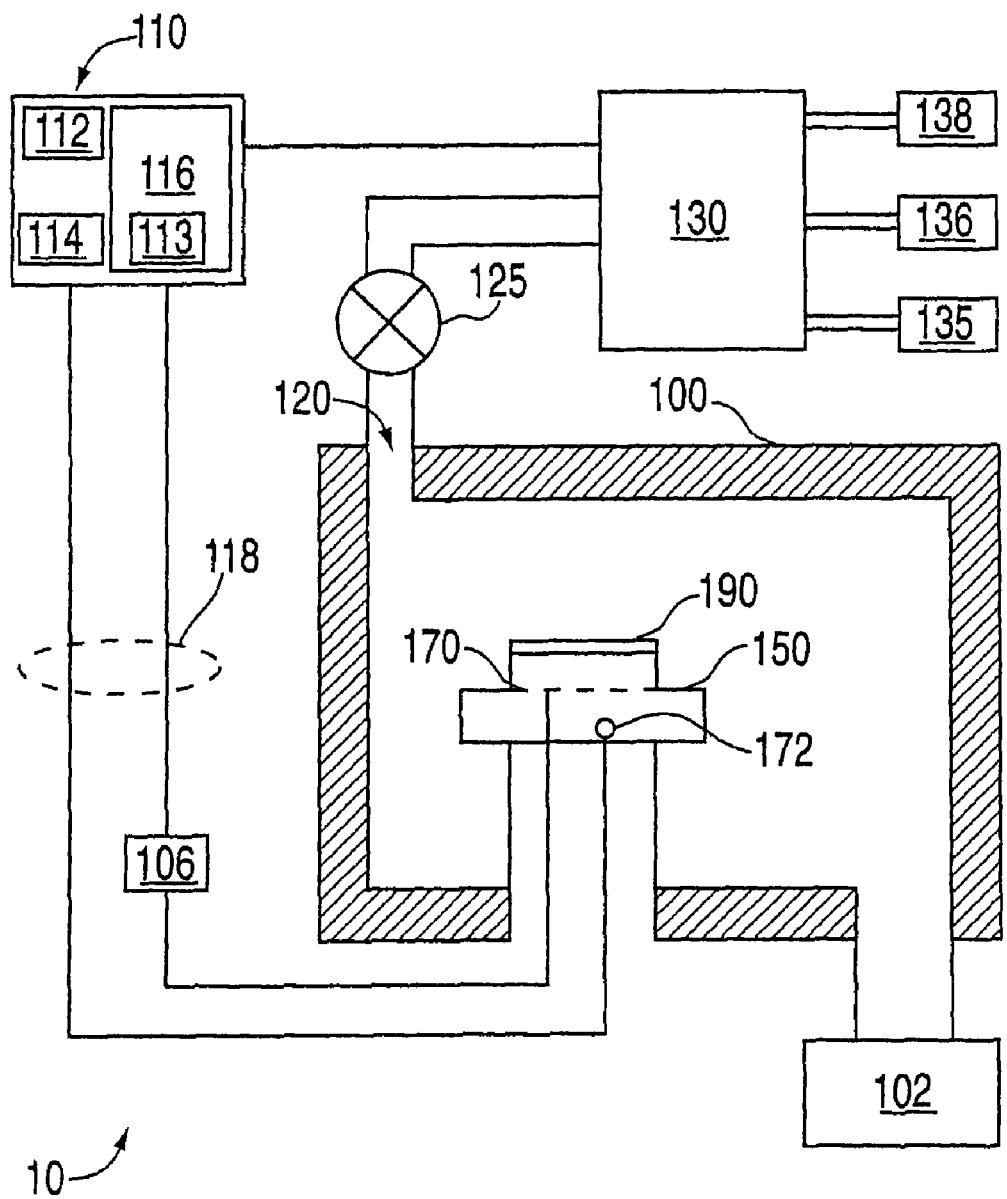
FIGS. 1 and 4 depict schematic illustrations of exemplary portions of process systems in accordance with one or more integrated circuit fabrication aspects of the present invention.

FIG. 1 depicts a schematic illustration of a wafer processing system 10 that can be used to form one or more tantalum-nitride barrier layers in accordance with aspects of the present invention described herein. System 10 comprises process chamber 100, gas panel 130, control unit 110, along with other hardware components such as power supply 106 and vacuum pump 102. For purposes of clarity, salient features of process chamber 100 are briefly described below.

Process Chamber

Process chamber 100 generally houses a support pedestal 150, which is used to support a substrate such as a semiconductor wafer 190 within process chamber 100. Depending on process requirements, semiconductor wafer 190 can be heated to some desired temperature or within some desired temperature range prior to layer formation using heater 170.

In chamber 100, wafer support pedestal 150 is heated by an embedded heating element 170. For example, pedestal 150 may be resistively heated by applying an electric current from an AC power supply 106 to heating element 170. Wafer 190 is, in turn, heated by pedestal 150, and may be maintained within a desired process temperature range of, for example, about 20 degrees Celsius to about 500 degrees Celsius.

Temperature sensor 172, such as a thermocouple, may be embedded in wafer support pedestal 150 to monitor the pedestal temperature of 150 in a conventional manner. For example, measured temperature may be used in a feedback loop to control electric current applied to heating element 170 from power supply 106, such that wafer temperature can be maintained or controlled at a desired temperature or within a desired temperature range suitable for a process application. Pedestal 150 may optionally be heated using radiant heat (not shown).

Vacuum pump 102 is used to evacuate process gases from process chamber 100 and to help maintain a desired pressure or desired pressure within a pressure range inside chamber 100. Orifice 120 through a wall of chamber 100 is used to introduce process gases into process chamber 100. Sizing of orifice 120 conventionally depends on the size of process chamber 100.

Orifice 120 is coupled to gas panel 130 in part by valve 125. Gas panel 130 is configured to receive and then provide a resultant process gas from two or more gas sources 135, 136 to process chamber 100 through orifice 120 and valve 125. Gas sources 135, 136 may store precursors in a liquid phase at room temperature, which are later heated when in gas panel 130 to convert them to a vapor-gas phase for introduction into chamber 100. Gas panel 130 is further configured to receive and then provide a purge gas from purge gas source 138 to process chamber 100 through orifice 120 and valve 125.

Control unit 110, such as a programmed personal computer, work station computer, and the like, is configured to control flow of various process gases through gas panel 130 as well as valve 125 during different stages of a wafer process sequence. Illustratively, control unit 110 comprises central processing unit (CPU) 112, support circuitry 114, and memory 116 containing associated control software 113. In addition to control of process gases through gas panel 130, control unit 110 may be configured to be responsible for automated control of other activities used in wafer processing—such as wafer transport, temperature control, chamber evacuation, among other activities, some of which are described elsewhere herein.

Control unit 110 may be one of any form of general purpose computer processor that can be used in an industrial setting for controlling various chambers and sub-processors. CPU 112 may use any suitable memory 116, such as random access memory, read only memory, floppy disk drive, hard disk, or any other form of digital storage, local or remote. Various support circuits may be coupled to CPU 112 for supporting system 10. Software routines 113 as required may be stored in memory 116 or executed by a second computer processor that is remotely located (not shown). Bi-directional communications between control unit 110 and various other components of wafer processing system 10 are handled through numerous signal cables collectively referred to as signal buses 118, some of which are illustrated in FIG. 1.

Barrier Layer Formation

Figure 2A:
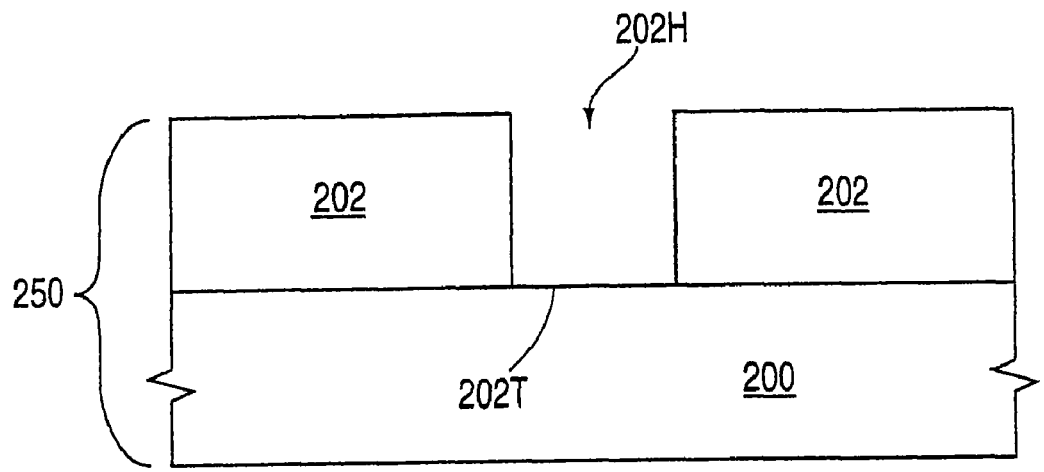
FIGS. 2a-2c depict cross-sectional views of a substrate structure at different stages of integrated circuit fabrication.
Figure 2B:
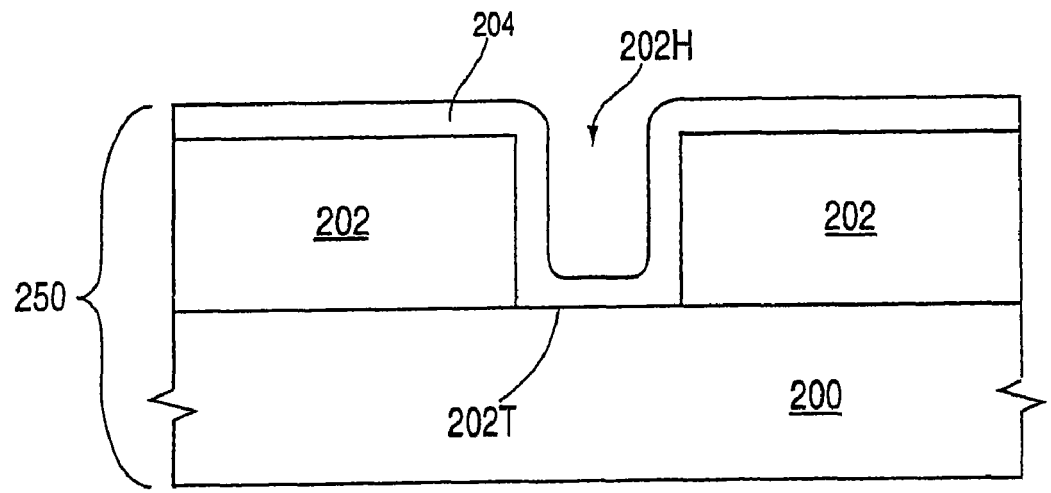
Figure 2C:
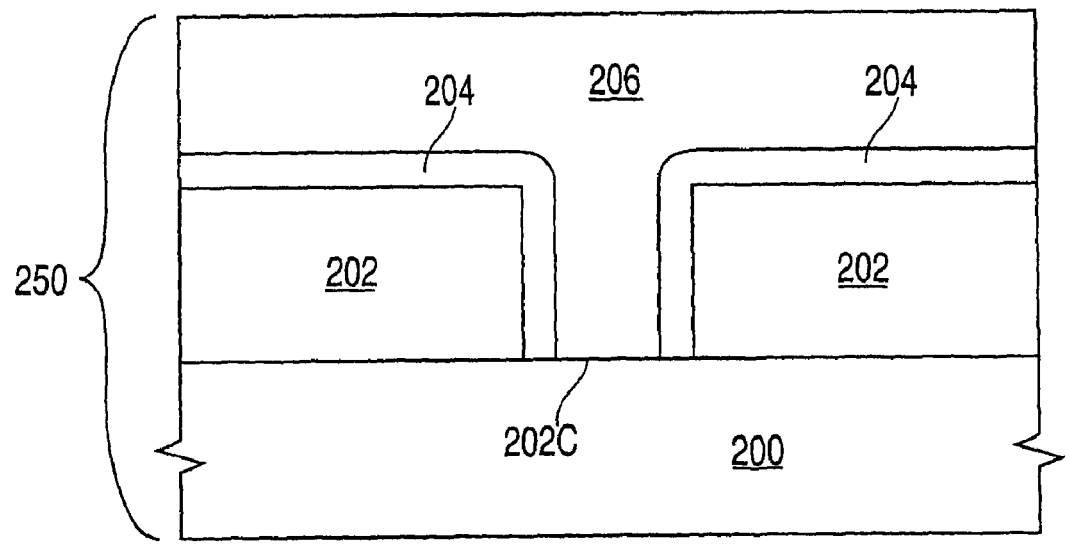

FIGS. 2a-2c illustrate exemplary embodiment portions of tantalum-nitride layer formation for integrated circuit fabrication of an interconnect structure in accordance with one or more aspects of the present invention. For purposes of clarity, substrate 200 refers to any workpiece upon which film processing is performed, and substrate structure 250 is used to denote substrate 200 as well as other material layers formed on substrate 200. Depending on processing stage, substrate 200 may be a silicon semiconductor wafer, or other material layer, which has been formed on wafer 190 (shown in FIG. 1).

FIG. 2a, for example, shows a cross-sectional view of a substrate structure 250, having a dielectric layer 202 thereon. Dielectric layer 202 may be an oxide, a silicon oxide, carbon-silicon-oxide, a fluoro-silicon, a porous dielectric, or other suitable dielectric formed and patterned to provide contact hole or via 202H extending to an exposed surface portion 202T of substrate 200. More particularly, it will be understood by those with skill in the art that the present invention may be used in a dual damascene process flow.

FIG. 2b illustratively shows tantalum-nitride layer 204 formed on substrate structure 250. Tantalum-nitride layer 204 is formed by chemisorbing monolayers of a tantalum containing compound and a nitrogen containing compound on substrate structure 250.

Referring to FIG. 2c, after the formation of tantalum-nitride layer 204, a portion of layer 204 may be removed by etching in a well-known manner to expose a portion 202C of substrate 200. Portion 202C may be part of a transistor gate stack, a capacitor plate, a node, a conductor, or like conductive element. Next, contact layer 206 may be formed thereon, for example, to form an interconnect structure. Contact layer 206 may be selected from a group of aluminum (Al), copper (Cu), tungsten (W), and combinations thereof.

Contact layer 206 may be formed, for example, using chemical vapor deposition (CVD), physical vapor deposition (PVD), electroplating, or a combination thereof. For example, an aluminum (Al) layer may be deposited from a reaction of a gas mixture containing dimethyl aluminum hydride (DMAH) and hydrogen ($H_2$) or argon (Ar) or other DMAH containing mixtures, a CVD copper layer may be deposited from a gas mixture containing Cu(hfac)$_2$ (copper (II) hexafluoro acetylacetonate), Cu(fod)$_2$ (copper (II) heptafluoro dimethyl octanediene), Cu(hfac) TMVS (copper (I)

hexafluoro acetylacetonate trimethylvinylsilane) or combinations thereof, and a CVD tungsten layer may be deposited from a gas mixture containing tungsten hexafluoride ($WF_6$). A PVD layer is deposited from a copper target, an aluminum target, or a tungsten target.

Moreover, layer 206 may be a refractory metal compound including but not limited to titanium (Ti), tungsten (W), tantalum (Ta), zirconium (Zr), hafnium (Hf), molybdenum (Mo), niobium (Nb), vanadium (V), and chromium (Cr), among others. Conventionally, a refractory metal is combined with reactive species, such as for example chlorine (Cl) or fluorine (F), and is provided with another gas to form a refractory metal compound. For example, titanium tetrachloride ($TiCl_4$), tungsten hexafluoride ($WF_6$), tantalum pentachloride ($TaCl_5$), zirconium tetrachloride ($ZrCl_4$), hafnium tetrachloride ($HfCl_4$), molybdenum pentachloride ($MoCl_5$), niobium pentachloride ($NbCl_5$), vanadium pentachloride ($VCl_5$), or chromium tetrachloride ($CrCl_4$) may be used as a refractory metal-containing compound gas.

Though layer 206 is shown as formed on layer 204, it should be understood that layer 204 may be used in combination with one or more other barrier layers formed by CVD or PVD. Accordingly, layer 204 need not be in direct contact with layer 206, but an intervening layer may exist between layer 206 and layer 204.

Monolayers are chemisorbed by sequentially providing a tantalum containing compound and a nitrogen containing compound to a process chamber. Monolayers of a tantalum containing compound and a nitrogen containing compound are alternately chemisorbed on a substrate 300 as illustratively shown in FIGS. 3a-3c.

Figure 3A:
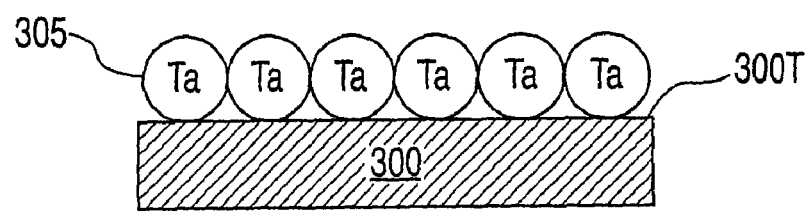
FIGS. 3a-3c depict cross-sectional views of a substrate at different stages of chemisorption to form a barrier layer.

FIG. 3a depicts a cross-sectional view of an exemplary portion of substrate 300 in a stage of integrated circuit fabrication, and more particularly at a stage of barrier layer formation. Tantalum layer 305 is formed by chemisorbing a tantalum-containing compound on surface portion 300T of substrate 300 by introducing a pulse of a tantalum containing gas 135 (shown in FIG. 1) into process chamber 100 (shown in FIG. 1). Tantalum containing gas 135 (shown in FIG. 1) may be a tantalum based organometallic precursor or a derivative thereof. Examples of such precursors include but are not limited to pentakis(ethylmethylamino) tantalum (PEMAT; $Ta(N(Et)Me)_5$), pentakis(diethylamino) tantalum (PDEAT; $Ta(NEt_2)_5$), pentakis(dimethylamino) tantalum (PDMAT; $Ta(NMe_2)_5$) or a derivative thereof. Other tantalum containing precursors include TBTDET ($^tBuTa(NEt_2)_3$ or $C_{16}H_{39}N_4Ta$), tantalum halides (e.g., $TaX_5$, where X is F, B or C) or a derivative thereof.

Wafer 190 is maintained approximately below a thermal decomposition temperature of a selected tantalum precursor or a derivative thereof to be used and maintained at a pressure of approximately less than 100 Torr. Additionally, wafer 190 may be heated by heating element 170. An exemplary temperature range for precursors identified herein is approximately 20 to 400 degrees Celsius. For example, approximately 150 to 300 degrees Celsius may be used for PEMAT.

Though temperatures below a thermal decomposition temperature may be used, it should be understood that other temperatures, namely those above a thermal decomposition temperature, may be used. An example temperature ranges above a thermal decomposition temperature is approximately 400 to 600 degrees Celsius. Accordingly, some thermal decomposition may occur; however, the main, more than 50 percent, deposition activity is by chemisorption. More generally, wafer surface temperature needs to be high enough to induce significant chemisorption of precursors instead of physisorption, but low enough to prevent significant decomposition of precursors. If the amount of decomposition during each precursor deposition is significantly less than a layer, then the primary growth mode will be ALD. Accordingly, such a film will tend to have ALD properties. However, it is possible if a precursor significantly decomposes, but an intermediate reactant is obtained preventing further precursor decomposition after a layer of intermediate reactant is deposited, then an ALD growth mode may still be obtained.

While not wishing to be bound by theory, it is believed that this tantalum-containing precursor combines tantalum atoms with one or more reactive species. During tantalum layer 305 formation, these reactive species form byproducts that are transported from process chamber 100 by vacuum system 102 while leaving tantalum deposited on surface portion 300T. However, composition and structure of precursors on a surface during atomic-layer deposition (ALD) is not precisely known. A precursor may be in an intermediate state when on a surface of wafer 190. For example, each layer may contain more than simply elements of tantalum (Ta) or nitrogen (N); rather, the existence of more complex molecules having carbon (C), hydrogen (H), and/or oxygen (O) is probable. Additionally, a surface may saturate after exposure to a precursor forming a layer having more or less than a monolayer of either tantalum (Ta) or nitrogen (N). This composition or structure will depend on available free energy on a surface of wafer 190, as well as atoms or molecules involved. Once all available sites are occupied by tantalum atoms, further chemisorption of tantalum is blocked, and thus the reaction is self-limiting.

After layer 305 of a tantalum containing compound is chemisorbed onto substrate 300, excess tantalum containing compound is removed from process chamber 10 by vacuum system 102 (shown in FIG. 1). Additionally, a pulse of purge gas 138 (shown in FIG. 1) may be supplied to process chamber 10 to facilitate removal of excess tantalum containing compound. Examples of suitable purge gases include but are not limited to helium (He), nitrogen ($N_2$), argon (Ar), and hydrogen ($H_2$), among others, and combinations thereof that may be used.

Figure 3B:
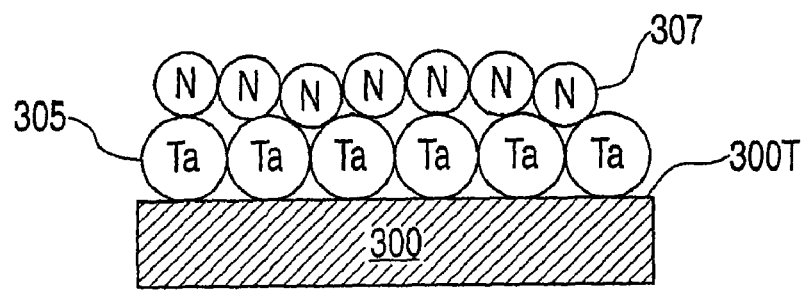
Figure 3C:
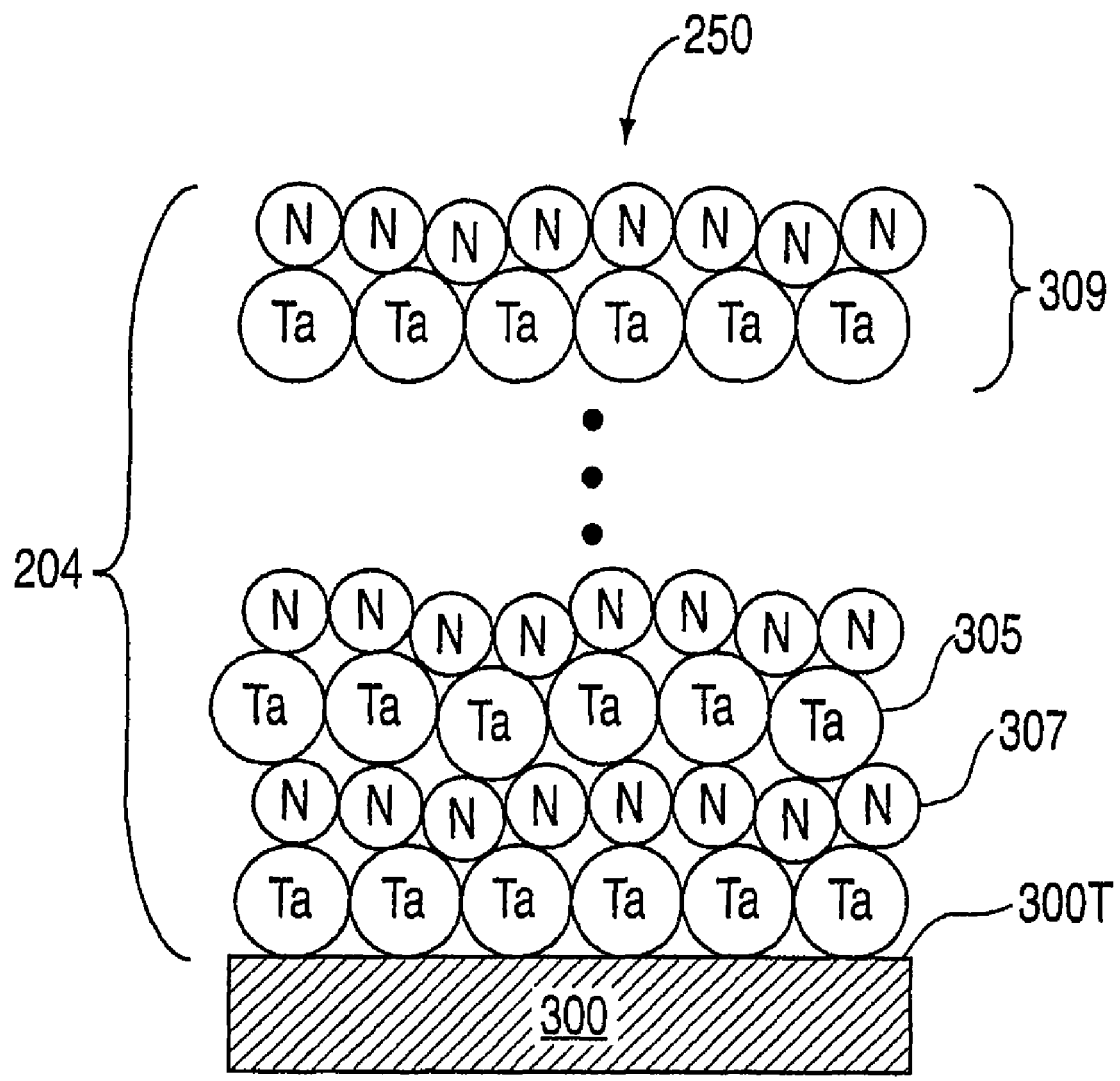

With continuing reference to FIGS. 3a-c and renewed reference to FIG. 1, after process chamber 100 has been purged, a pulse of ammonia gas ($NH_3$) 136 is introduced into process chamber 100. Process chamber 100 and wafer 190 may be maintained at approximately the same temperature and pressure range as used for formation of layer 305.

In FIG. 3b, a layer 307 of nitrogen is illustratively shown as chemisorbed on tantalum layer 305 at least in part in response to introduction of ammonia gas 136. While not wishing to be bound by theory, it is believed that nitrogen layer 307 is formed in a similar self-limiting manner as was tantalum layer 305. Each tantalum layer 305 and nitrogen layer 307 in any combination and in direct contact with one another form a sublayer 309, whether or not either or both or neither is a monolayer. Though ammonia gas is used, other N containing precursors gases may be used including but not limited to $N_xH_y$ for x and y integers (e.g., $N_2H_4$), $N_2$ plasma source, $NH_2N(CH_3)_2$, among others.

After an ammonia gas compound is chemisorbed onto tantalum layer 305 on substrate 300 to form nitrogen monolayer 307, excess ammonia gas compound is removed from process chamber 10 by vacuum system 102, and additionally, a pulse of purge gas 138 may be supplied to process chamber 10 to facilitate this removal.

Thereafter, as shown in FIG. 3c, tantalum and nitrogen layer deposition in an alternating sequence may be repeated with interspersed purges until a desired layer 204 thickness is achieved. Tantalum-nitride layer 204 may, for example, have a thickness in a range of approximately 0.0002 microns (2 Angstrom) to about 0.05 microns (500 Angstrom), though a thickness of approximately 0.001 microns (10 Angstrom) to about 0.005 microns (50 Angstrom) may be a sufficient barrier. Moreover, a tantalum-nitride layer 204 may be used as a thin film insulator or dielectric, or may be used as a protective layer for example to prevent corrosion owing to layer 204 being relatively inert or non-reactive. Advantageously, layer 204 may be used to coat any of a variety of geometries.

In FIGS. 3a-3c, tantalum-nitride layer 204 formation is depicted as starting with chemisorption of a tantalum containing compound on substrate 300 followed by chemisorption of a nitrogen containing compound. Alternatively, chemisorption may begin with a layer of a nitrogen containing compound on substrate 300 followed by a layer of a tantalum containing compound.

Pulse time for each pulse of a tantalum containing compound, a nitrogen containing compound, and a purge gas is variable and depends on volume capacity of a deposition chamber 100 employed as well as vacuum system 102 coupled thereto. Similarly, time between each pulse is also variable and depends on volume capacity of process chamber 100 as well as vacuum system 102 coupled thereto. However, in general, wafer 190 surface must be saturated by the end of a pulse time, where pulse time is defined as time a surface is exposed to a precursor. There is some variability here, for example (1) a lower chamber pressure of a precursor will require a longer pulse time; (2) a lower precursor gas flow rate will require a longer time for chamber pressure to rise and stabilize requiring a longer pulse time; and (3) a large-volume chamber will take longer to fill, longer for chamber pressure to stabilize thus requiring a longer pulse time. In general, precursor gases should not mix at or near the wafer surface to prevent co-reaction (a co-reactive embodiment is disclosed elsewhere herein), and thus at least one gas purge or pump evacuation between precursor pulses should be used to prevent mixing.

Generally, a pulse time of less than about 1 second for a tantalum containing compound and a pulse time of less than about 1 second for a nitrogen containing compound is typically sufficient to chemisorb alternating monolayers that comprise tantalum-nitride layer 204 on substrate 300. A pulse time of less than about 1 second for purge gas 138 is typically sufficient to remove reaction byproducts as well as any residual materials remaining in process chamber 100.

Sequential deposition as described advantageously provides good step coverage and conformality, due to using a chemisorption mechanism for forming tantalum-nitride layer 204. With complete or near complete saturation after each exposure of wafer 190 to a precursor, each of uniformity and step coverage is approximately 100 percent. Because atomic layer deposition is used, precision controlled thickness of tantalum-nitride layer 204 may be achieved down to a single layer of atoms. Furthermore, in ALD processes, since it is believed that only about one atomic layer may be absorbed on a topographic surface per "cycle," deposition area is largely independent of the amount of precursor gas remaining in a reaction chamber once a layer has been formed. By "cycle," it is meant a sequence of pulse gases, including precursor and purge gases, and optionally one or more pump evacuations. Also, by using ALD, gas-phase reactions between precursors are minimized to reduce generation of unwanted particles.

Co-Reaction

Though it has been described to alternate tantalum and nitrogen containing precursors and purging in between as applied in a sequential manner, another embodiment is to supply tantalum and nitrogen containing precursors simultaneously. Thus, pulses of gases 135 and 136, namely, tantalum and nitrogen containing compounds, are both applied to chamber 100 at the same time. An example is PEMAT and $NH_3$, though other tantalum-organic and nitrogen precursors may be used. Step coverage and conformality is good at approximately 95 to 100 percent for each. Moreover, deposition rate is approximately 0.001 to 0.1 microns per second. Because a co-reaction is used, purging between sequential pulses of alternating precursors is avoided, as is done in ALD.

Wafer surface temperature is maintained high enough to sustain reaction between two precursors. This temperature may be below chemisorption temperature of one or both precursors. Accordingly, temperature should be high enough for sufficient diffusion of molecules or atoms.

Wafer surface temperature is maintained low enough to avoid significant decomposition of precursors. However, more decomposition of precursors may be acceptable for co-reaction than for sequentially reacting precursors in an ALD process. In general, wafer 190 surface diffusion rate of molecules or atoms should be greater than precursors' reaction rate which should be greater precursors' decomposition rate.

For all other details, the above-mentioned description for sequentially applied precursors applies to co-reaction processing.

Plasma Anneal

Figure 4:
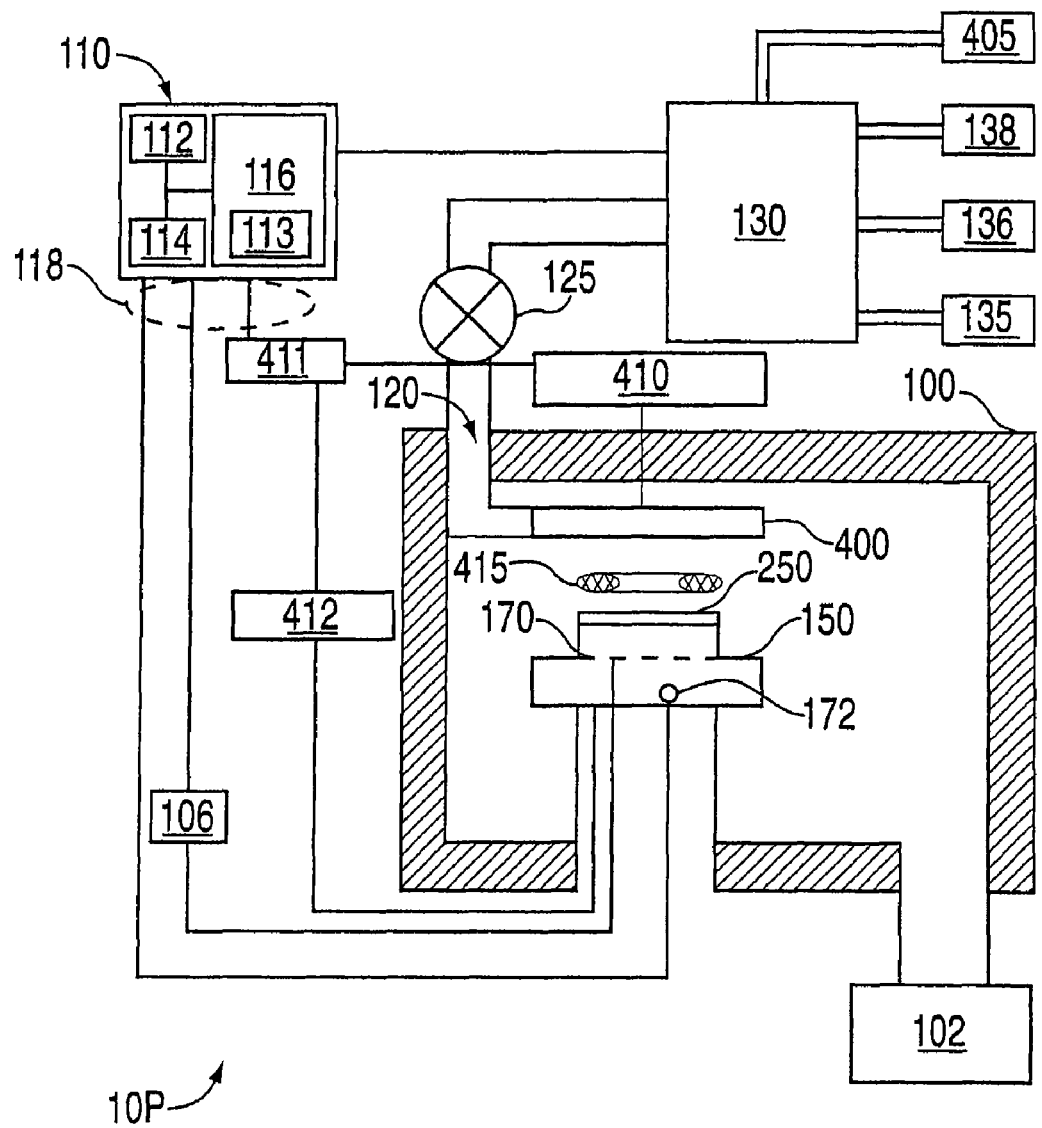

After forming one or more combinations of layers 305 and 307, substrate structure 250 may be plasma annealed. Referring to FIG. 4, there is illustratively shown a schematic diagram of an exemplary portion of a process system 10P in accordance with an aspect of the present invention. Process system 10P is similar to process system 10, except for additions of one or more RF power supplies 410 and 412, showerhead 400, gas source 405, and matching network(s) 411. Notably, a separate plasma process system may be used; however, by using a CVD/PVD process system 10P, less handling of substrate structure 250 is involved, as layer 204 may be formed and annealed in a same chamber 100.

Showerhead 400 and wafer support pedestal 150 provide in part spaced apart electrodes. An electric field may be generated between these electrodes to ignite a process gas introduced into chamber 100 to provide a plasma 415. In this embodiment, argon is introduced into chamber 100 from gas source 405 to provide an argon plasma. However, if argon is used as a purge gas, gas source 405 may be omitted for gas source 138.

Conventionally, pedestal 150 is coupled to a source of radio frequency (RF) power source 412 through a matching network 411, which in turn may be coupled to control unit 110. Alternatively, RF power source 410 may be coupled to showerhead 400 and matching network 411, which in turn may be coupled to control unit 110. Moreover, matching network 411 may comprise different circuits for RF power sources 410 and 412, and both RF power sources 410 and 412 may be coupled to showerhead 400 and pedestal 150, respectively.

With continuing reference to FIG. 4 and renewed reference to FIG. 3c, substrate structure 250 having one or more iterations or tantalum-nitride sublayers 309 is located in process chamber 401. Argon (Ar) gas from gas source 405 is introduced into chamber 401 to plasma anneal substrate structure 250. While not wishing to be bound by theory, it is believed that plasma annealing reduces nitrogen content of one or more sublayers 309 by sputtering off nitrogen, which in turn reduces resistivity. In other words, plasma annealing is believed to make tantalum-nitride layer 204 more tantalum-rich as compared to a non-plasma annealed tantalum-nitride layer 204. For example, a 1:1 Ta:N film may be annealed to a 2:1 Ta:N film. Tantalum-nitride films having a sheet resistance of approximately equal to or less than 1200 microohms-cm for 0.004 micron (40 Angstrom) films may be achieved.

It will be appreciated that other non-chemically reactive gases with respect to layer 204 may be used for physically displacing nitrogen from layer 204, including but not limited to neon (Ne), xenon (Xe), helium (He), and hydrogen ($H_2$). Generally, for a plasma-gas that does not chemically react with a tantalum-nitride film, it is desirable to have a plasma-gas atom or molecule with an atomic-mass closer to N than to Ta in order to have preferential sputtering of the N. However, a chemically reactive process may be used where a gas is selected which preferentially reacts for removal of N while leaving Ta.

Figure 5:
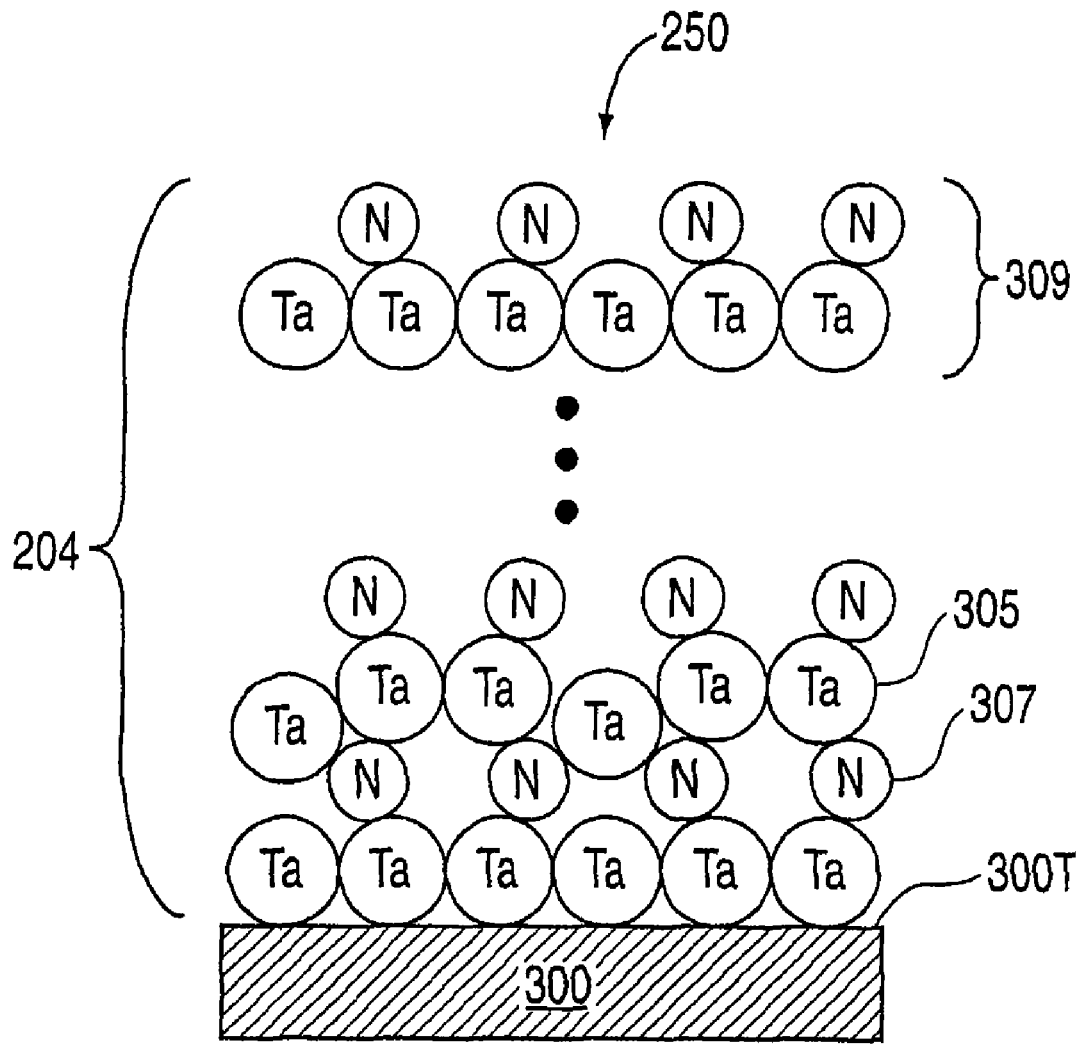
FIG. 5 depicts a cross-sectional view of a substrate structure at different stages of integrated circuit fabrication incorporating one or more tantalum-nitride barrier sublayers post plasma anneal.

Referring to FIG. 5, there is illustratively shown a cross sectional view of layer 204 after plasma annealing in accordance with a portion of an exemplary embodiment of the present invention. Plasma annealing may be done after formation of each nitrogen layer 307, or may be done after formation of a plurality of layers 307. With respect to the latter, plasma annealing may take place after approximately every 0.003 to 0.005 microns (30 to 50 Angstroms) of layer 204 or after formation of approximately every 7 to 10 sublayers 309. However, plasma annealing may be done after formation of a sublayer 309, which is approximately 0.0001 to 0.0004 microns (1 to 4 Angstroms).

Plasma annealing with argon may be done with a wafer temperature in a range of approximately 20 to 450 degrees Celsius and a chamber pressure of approximately 0.1 to 50 Torr with a flow rate of argon in a range of approximately 10 to 2,000 standard cubic centimeters per minute (sccm) with a plasma treatment time approximately equal to or greater than one second. Generally, a tantalum-nitride film should be annealed at a temperature, which does not melt, sublime, or decompose such a tantalum-nitride film.

The specific process conditions disclosed in the above description are meant for illustrative purposes only. Other combinations of process parameters such as precursor and inert gases, flow ranges, pressure ranges and temperature ranges may be used in forming a tantalum-nitride layer in accordance with one or more aspects of the present invention.

Although several preferred embodiments, which incorporate the teachings of the present invention, have been shown and described in detail, those skilled in the art can readily devise many other varied embodiments that still incorporate these teachings. By way of example and not limitation, it will be apparent to those skilled in the art that the above-described formation is directed at atomic layer CVD (ALCVD); however, low temperature CVD may be used as described with respect to co-reacting precursors. Accordingly, layers 305 and 307 need not be monolayers. Moreover, it will be appreciated that the above described embodiments of the present invention will be particularly useful in forming one or more barrier layers for interconnects on semiconductor devices having a wide range of applications.

While the foregoing is directed to embodiments of the present invention, other and further embodiments of the invention may be devised without departing from the basic scope thereof, and the scope thereof is determined by the claims that follow.

The invention claimed is:

1. A method of forming a tantalum nitride film, comprising:
    forming a tantalum nitride layer on a substrate in a processing chamber by simultaneously pulsing a tantalum containing precursor and a nitrogen containing precursor in the processing chamber.

2. The method of claim 1, further comprising:
    reducing a nitrogen concentration of the tantalum nitride layer by exposing the substrate to a plasma annealing process in the processing chamber.

3. The method of claim 2, wherein the plasma annealing process is performed with a plasma source material chemically non-reactive to the tantalum-nitride layer and having an atomic mass closer to nitrogen than tantalum.

4. The method of claim 2, wherein the plasma annealing process is performed with a plasma source material selected from argon (Ar), xenon (Xe), helium (He), neon (Ne), hydrogen (H2), nitrogen (N2), and combinations thereof.

5. The method of claim 2, wherein the plasma generated in the plasma annealing process is ignited by a radio frequency field.

6. The method of claim 1, further comprising:
    depositing a metal-containing layer on the tantalum nitride layer.

7. The method of claim 6, wherein the metal-containing layer comprises a metal selected from the group consisting of aluminum, copper, tungsten, tantalum and alloys thereof.

8. The method of claim 1, wherein the tantalum nitride layer has a thickness within a range from about 10 Å and about 50 Å.

9. The method of claim 1, wherein the nitrogen precursor contains a compound selected from the group consisting of nitrogen, ammonia, hydrazine, plasmas thereof, derivatives thereof and combinations thereof.

10. The method of claim 1, wherein the tantalum containing precursor is a tantalum based organo-metallic precursor selected from pentakis(ethylmethylamino) tantalum (PEMAT), pentakis(diethylamino) tantalum (PDEAT), pentakis (dimethylamino) tantalum (PDMAT) and derivatives thereof.

11. The method of claim 1, wherein the tantalum containing precursor is a tantalum based organo-metallic precursor selected from Ta(NMe2)5, Ta(NEt2)5, TBTDET and tantalum halides.

12. A method of forming a tantalum nitride film, comprising:
    simultaneously pulsing tantalum and nitrogen containing precursors into a processing chamber;
    forming a tantalum nitride layer on a substrate in the processing chamber from the pulsed tantalum containing and nitrogen containing precursors;
    reducing a nitrogen concentration of the formed tantalum nitride layer by exposing the substrate to a plasma annealing process in the processing chamber; and
    depositing a metal-containing layer on the annealed tantalum nitride layer.

13. The method of claim 12, wherein the plasma annealing process is performed with a plasma source material chemically non-reactive to the tantalum-nitride layer and having an atomic mass closer to nitrogen than tantalum.

14. The method of claim 12, wherein the plasma annealing process is performed with a plasma source material selected from argon (Ar), xenon (Xe), helium (He), neon (Ne), hydrogen (H2), nitrogen (N2), and combinations thereof.

15. The method of claim 12, wherein the plasma generated in the plasma annealing process is ignited by a radio frequency field.

16. The method of claim 12, wherein the metal-containing layer comprises a metal selected from the group consisting of aluminum, copper, tungsten, tantalum and alloys thereof.

17. The method of claim 12, wherein the nitrogen precursor contains a compound selected from the group consisting of nitrogen, ammonia, hydrazine, plasmas thereof, derivatives thereof and combinations thereof.

18. The method of claim 12, wherein the tantalum containing precursor is a tantalum based organo-metallic precursor selected from pentakis(ethylmethylamino) tantalum (PEMAT), pentakis(diethylamino) tantalum (PDEAT), pentakis(dimethylamino) tantalum (PDMAT) and derivatives thereof.

19. The method of claim 1, wherein the tantalum containing precursor is a tantalum based organo-metallic precursor selected from Ta(NMe2)5, Ta(NEt2)5, TBTDET and tantalum halides.

20. A method of forming a tantalum nitride film, comprising:
  simultaneously flowing tantalum and nitrogen containing precursors into a processing chamber in pulses;
  forming a tantalum nitride layer on a substrate in the processing chamber from the pulsed tantalum containing and nitrogen containing precursors by reacting the tantalum containing precursor with the nitrogen containing precursor.

* * * * *